United States Patent [19]
Hall et al.

[11] Patent Number: 5,336,335
[45] Date of Patent: Aug. 9, 1994

[54] COLUMNAR-GRAINED POLYCRYSTALLINE SOLAR CELL AND PROCESS OF MANUFACTURE

[75] Inventors: Robert B. Hall; Allen M. Barnett; Jacob E. Brown; Joseph C. Checchi, all of Newark; David H. Ford; Christopher L. Kendall, both of Wilmington; William P. Mulligan, Hockessin, all of Del.; James A. Rand, Oxford, Pa.; Todd R. Ruffins, Newark, Del.

[73] Assignee: AstroPower, Inc., Newark, Del.

[21] Appl. No.: 959,009

[22] Filed: Oct. 9, 1992

[51] Int. Cl.⁵ .............. H01L 31/0392; H01L 31/0368; H01L 31/18
[52] U.S. Cl. .................... 136/258; 148/33.2; 148/DIG. 122; 437/4; 437/173; 437/174; 437/233; 437/967; 428/620; 257/51
[58] Field of Search ............. 136/258 PC; 257/51; 437/4, 12, 173-174, 233, 247-248, 967; 427/74; 428/620; 148/33.2, DIG. 122

[56] References Cited

U.S. PATENT DOCUMENTS 3,953,876 4/1976 Sirtl et al. ..................... 437/2

FOREIGN PATENT DOCUMENTS 3536743 4/1987 Fed. Rep. of Germany ...... 136/258 PC

OTHER PUBLICATIONS

The Conference Record of the 17th IEEE Photovoltaic Specialists Conference May 1, 1984, Kissimee, Florida, US pp. 1382–1383 Norman et al. 'Solar Grade Si Substrates by the Powder-to-Ribbon Process'.
The Conference Record of the 19th IEEE Photovoltaic Specialists Conference May 4, 1987, New Orleans, Louisiana, US pp. 1486–1487 Harris et al. 'The Production of Silicon Layers on Graphite for Photovoltaic Use'.
Journal of Crystal Growth vol. 104, No. 1, Jul. 1, 1990, Amsterdam NL pp. 108–112 Lange et al. 'Ribbon Growth on Substrate(RGS)—A New Approach to High Speed Growth of Silicon Ribbons for Photovoltaic'.
A. Eyer et al, Conf. Record, 18th IEEE Photovoltaic Specialists Conf. (1985), pp. 1138–1141.
A. Eyer et al, Conf. Record, 19th IEEE Photovoltaic Specialists Conf. (1987), pp. 951–954.
A. Eyer et al, Conf. Record, 20th IEEE Photovoltaic Specialists Conf. (1988), pp. 1565–1568.

Primary Examiner—Aaron Weisstuch
Attorney, Agent, or Firm—Connolly & Hutz

[57] ABSTRACT

The invention relates to techniques for manufacturing columnar-grained polycrystalline sheets which have particular utility as substrates or wafers for solar cells. The sheet is made by applying granular silicon to a setter material which supports the granular material. The setter material and granular silicon are subjected to a thermal profile all of which promote columnar growth by melting the silicon from the top downwardly. The thermal profile sequentially creates a melt region at the top of the granular silicon and then a growth region where both liquid and a growing polycrystalline sheet layer coexist. An annealing region is created where the temperature of the grown polycrystalline silicon sheet layer is controllably reduced to effect stress relief.

31 Claims, 1 Drawing Sheet

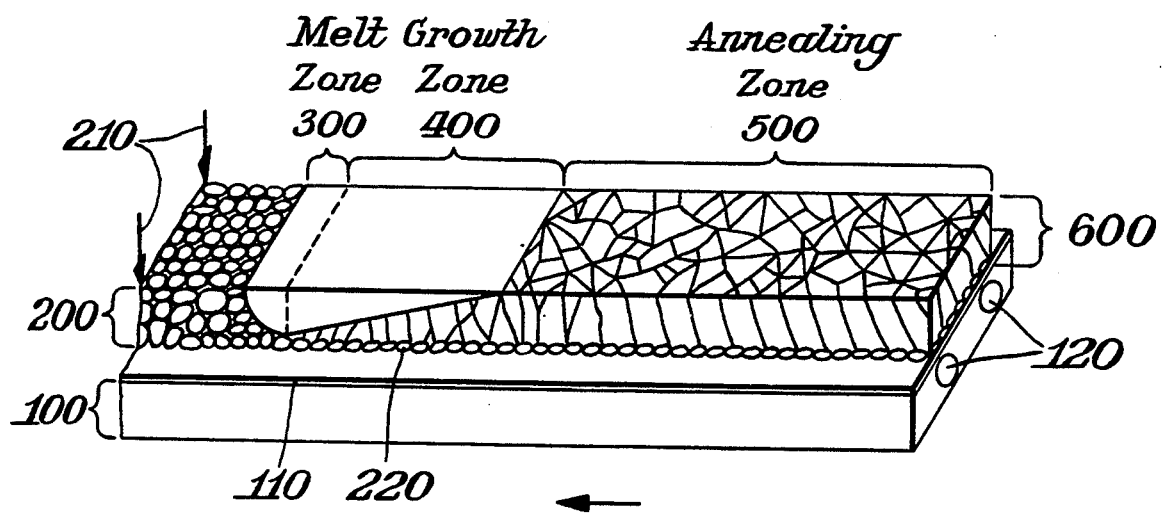

COLUMNAR-GRAINED POLYCRYSTALLINE SOLAR CELL AND PROCESS OF MANUFACTURE

BACKGROUND OF THE INVENTION

Photovoltaic solar cells are semiconductor devices which convert sunlight into electricity. Solar cells based on crystalline silicon offer the advantage of high performance and stability. The principal barrier to expanded utilization of silicon solar cells for electric power generation is the present high cost of the solar cells.

In conventional solar cells based on single crystal or large grain polycrystalline silicon ingot processes, the major cost factor is determined by the requirement of sawing ingots into wafers. Sawing is an expensive processing step, and furthermore results in the loss of approximately half the costly ingot material as silicon dust. The problem to be solved requires the development of a low-cost process, that efficiently employs low-cost materials while maintaining solar cell performance.

The technical requirements for a solution to the problem are based on the achievement of a process that is controllable, has high areal throughput, and generates material with adequate crystalline morphology. The prior art includes several processes which either effectively achieve controlled growth, or high areal throughput of silicon sheet or ribbons. All these approaches eliminate the costly process of sawing large areas to create wafers from ingots. For example, publications by Hopkins (WEB), Ettouney, et al. (EFG), Gurtler (RTR) and Eyer, et al. (SSP) describe processes that achieve controlled polycrystalline growth of grains greater them 1 mm in size at low linear speeds (and consequently low areal generation rates). Common to these sheet growth processes is the fact that the sheet pulling direction and the direction of sheet growth are collinear. All of these processes employ a large temperature gradient (>500 degrees Centigrade per centimeter) along the sheet growth direction. This gradient is necessary to achieve the practical linear speed indicated (typically less than 2 cm/min), but also introduces large thermal-induced stresses. In many cases these stresses limit the practical sheet width that can be achieved by causing sheet deformations which make solar cell fabrication untenable. Thermal stresses can also create crystalline defects which limit solar cell performance. Each of these processes attempts to achieve grain sizes that are as large as possible in order to avoid the deleterious effects of grain boundaries on solar cell performance.

Another set of processes has been developed that can achieve high areal throughput rates. For example, publications by Bates, et al. (LASS), Helmreich, et al. (RAFT), Falckenberg, et al. (S-Web), Hide, et al. (CRP) and Lange, et al. (RGS) describe processes that achieve polycrystalline sheet growth with grain sizes in the 10 microns to 3 mm range at high linear rates (10 to 1800 cm/min). Typically, these processes have difficulty maintaining geometric control (width and thickness) (e.g. (LASS, RAFT, RGS), and/or experience difficulty with contamination of the silicon by the contacting materials (e.g. RAFT, S-Web, CRP). Common to these sheet growth processes is the fact that the sheet pulling direction and the direction of crystalline growth in the sheet are nearly perpendicular. It is this critical feature of these processes that allows the simultaneous achievement of high linear pulling speeds and reduced crystal growth speeds. Reduced crystal growth speeds are necessary for the achievement of materials with high crystalline quality.

The prior art regarding the fabrication of solar cells from polycrystalline materials requires that the grain size be greater than 1.0 mm. This requirement on grain size was necessitated by the need to minimize the deleterious effects of grain boundaries evident in prior art materials. Historically, small-grained polycrystalline silicon (grain size less than 1.0 mm) has not been a candidate for photovoltaic material due to grain boundary effects. Grain boundary recombination led to degradation of voltage, current and fill factors in the solar cell. Previous models, for example Ghosh (1980) and Fossum (1980), based on recombination at active gain boundaries correctly predicted performance of historical materials. By inference these models teach that the achievement of inactive grain boundaries permits the utilization of small grained materials.

SUMMARY OF THE INVENTION

It is the object of this invention to provide a low-cost process for forming low stress, columnar-grained sheets that are employed in high performance solar cells.

A further object of this invention is to provide techniques for manufacturing columnar-gained polycrystalline silicon sheets for use as a substrate in solar cells, which overcomes the disadvantages of the prior art.

A yet further object of this invention is to provide a process for manufacturing a low-cost solar cell that employs small-grained polycrystalline silicon with low-activity grain boundaries.

A still further object of this invention is to provide a substrate and a solar cell made from such process.

In accordance with this invention the sheet is formed by using a columnar growth technique that controls the details of heat flow, and thus growth speed of the polycrystalline material. The process begins with granular silicon that is applied to a setter material; the setter and silicon are then subjected to a designed thermal sequence which results in the formation of a columnar-grained polycrystalline silicon sheet at high areal throughput rates. The equipment employed to accomplish the process includes a line source of energy and a polycrystalline sheet growth and annealing technology.

BRIEF DESCRIPTION OF THE DRAWING

The single FIGURE illustrates a perspective view slowing the sequence for fabricating low stress, columnar-grained silicon sheets usable as solar cells substrates in accordance with this invention.

DETAILED DESCRIPTION

The present invention is directed to techniques used for making improved columnar grain polycrystalline sheets which are particularly adaptable for use as substrates or wafers in solar cells. The ability to use the sheet as a solar cell substrate makes possible the provision of a solar cell consisting entirely of silicon material where the sheet would function as a substrate made of silicon and the remaining layers of the solar cell would also be made of silicon.

The desired properties of the columnar-grained silicon sheet or substrate fabricated for inclusion in a low-cost solar cell in accordance with the teachings of this invention are: flatness, a smooth surface, minority carrier diffusion length greater than 40 microns, minimum grain dimension at least two times the minority carrier diffusion length, low residual stress and relatively inactive gain boundaries. Since the minimum grain dimension of the columnar grain silicon sheet is at least two times the minority carrier diffusion length which in turn is greater than 40 microns, the columnar grains would have a grain size greater than 80 microns. The desired properties of a process for fabricating columnar-grain silicon material appropriate for inclusion in a low-cost solar cell in accordance with the teachings of this invention are: low thermal stress procedure, controlled nucleation, high areal throughput, and simple process control.

The criteria for the columnar-grain silicon material product of flatness and smoothness are required to make solar cell fabrication tenable. The requirements on diffusion length and grain size are to minimize recombination losses in the bulk and at grain surfaces (i.e. grain boundaries), respectively. The requirement of relatively inactive grain boundaries is to effect the minimization of grain boundary recombination. The requirement of low residual stress is to minimize mechanical breakage and to maintain high minority carrier diffusion lengths.

The criteria for the columnar-grained silicon process of a low thermal stress procedure is to effect minimization of bulk crystalline defects. The requirement of controlled nucleation is to affect the achievement of the required grain morphology and size. The criteria for high areal throughput and simple process control are to achieve low-cost and manufactuarability.

The single FIGURE is a perspective view illustrating the sequence for fabricating low stress, columnar-grained silicon sheets. The process as depicted moves from left to right. In general, a setter material 100, which serves as a mechanical support, is coated with a granular silicon layer 200, and is passed through a prescribed thermal profile. The prescribed thermal profile first creates a melt region 300 at the top of the granular silicon 200, and then creates a growth region 400 where both liquid and a growing layer of polycrystalline layer coexist. Finally, there is an annealing region 500 where the temperature of the polycrystalline silicon sheet layer 600 is reduced in a prescribed manner to effect stress relief.

The setter material 100 is selected based on the following requirements. It must: maintain its shape during the sheet formation thermal processing; not chemically interact with, or adhere to, the silicon material; and possess the proper thermal characteristics to effect the required sheet growth and annealing. The form of the setter material may either be as a rigid board or as a flexible thin belt.

Several materials including, but not limited to, quartz, refractory boards (e.g. silica and/or alumina), graphite, and silicon carbide have been employed and maintained the proper geometric shape during thermal processing.

To assure that the setter 100 does not adhere to the final polycrystalline silicon sheet 600, a release agent coating 110 is applied to the setter. Either, or a combination of, silicon nitride, silicon oxynitride, silica, or alumina have been employed as this agent. A low-cost method for applying this coating is to form a liquid slurry that is painted or sprayed on the bare setter, and then subsequently dried in an oxidizing atmosphere before use. The release agent facilitates separation of the sheet and permits reuse of the setter material.

In the process design the thermal characteristics of the setter 100 play a key role in managing the melt and growth processes. In the melt region 300 it is preferred that the thermal conductivity of the setter be low to assure the efficient deployment of the energy being used to melt the granular silicon 200. The thermal properties of the setter may be tailored to possess a strip of higher thermal conductivity under the outer edges 210 of the strip of granular silicon. The effect of this strip is to define the outer edges of the growing sheet. The thermal conductivity of the setter may also be tailored to assist in defining nucleation sites to commence growth. This can be accomplished by locally placing thermal shunts 120 in the setter. These shunts 120 provide a thermal conduction path between the top and bottom of the setter, effecting a local path for removing the heat of solidification, and result in sates where nucleated growth occurs.

In a preferred embodiment the setter material is low density 1.5 cm thick silica board. The setter preparation is completed by coating the top surface with a release agent 110. This is accomplished using an aqueous colloidal solution of silicon nitride that is painted on the top surface and baked in an oxidizing atmosphere to form a non-wetting, non-adhering oxynitride layer, before the initial application of granular silicon.

The granular silicon 200 is selected based on the following requirements. It must: be properly sized; be of adequate purity; and contain a chemical ingredient to provide a p-type resistivity of the grown silicon sheet 600 in the range of 0.1 to 10 ohm-cm.

The range of proper sizes for the granular silicon 200 employed in the process is between 100 and 1000 micrometers. The upper limit is determined by the design thickness for the silicon sheet material. As a rule the minimum dimension of the largest silicon particles should be equal to or less than the desired thickness of the silicon sheet material. The lower size limit of the particle distribution is dependent on the dynamics of the melting process, and the need to limit the amount of silicon oxide. The silicon oxide is a source of sheet contamination, and naturally occurs at all silicon surfaces.

The purity level necessary in the sheet silicon is determined by the requirements for the efficient operation of a solar cell device fabricated on the sheet. Whereas the employment of low-processing metallurgical grade silicon is not adequate, utilization of highly processed semiconductor grade silicon is not necessary. In practice, the preferred process can be executed with off-grade semiconductor grade silicon. It is also an advantage of the preferred process that an additional degree of impurity reduction is accomplished during sheet growth by segregation of impurities to the sheet surface, where they may easily be removed by a subsequent chemical etch. This mechanism for purification by segregation is operative in the preferred process as the actual crystalline growth rate is less than 0.1 cm/min in the crystal growth direction, comparable to that employed in the single crystal float zone process. This mechanism is not operative in sheet growth technologies that have the crystalline growth rate equal to the sheet pulling speed (approx., 2 cm/min). At these higher growth velocities, there is not sufficient time for effective segregation to occur between liquid and solid as the process is diffusion limited.

It is necessary to provide for the addition of a separate constituent in, or with, the granular silicon to effect an electrical resistivity in the range of 0.1 to 10 ohm-cm in the sheet material. Typically, for p-type conductivity in the sheet material one preferred elements are boron, aluminum, or indium. As an example of the preferred embodiment, the addition of powdered boron silicide followed by mechanical mixing of the granular silicon provides for the accomplishment of the required p-type resistivity in the subsequently grown silicon sheet.

The properly doped p-type granular silicon 200 is uniformly layered on the coated setter 100. For example, this process can be effectively accomplished by using a doctor blade. The spacing between the edge of the doctor blade and the setter surface needs to be at least two times the minimum dimension of the largest particle in the granular silicon size distribution. Furthermore, the thickness of the final silicon sheet 600 can be as little as the minimum dimension of the largest particle in the granular size distribution.

The silicon-coated setter is transported into an environmental cheer with an argon overpressure. In a preferred embodiment a mixture of argon and hydrogen gas is employed to effectively limit the amount of silicon oxide that is formed during the growth process. The percent of hydrogen employed is determined by the water vapor content in the chamber. The ratio of hydrogen to water vapor controls the magnitude of silicon oxide formation. The chamber may include a pre-heat zone employed to raise the temperature to 1100° to 1400° C., which in combination with the hydrogen present has the effect of reducing the native oxide of silicon that exists on the granular silicon.

After the granular silicon 200 has been pre-heated it is then brought into a thermal zone 300 where the top portion of the granular silicon layer 200 is melted. In the preferred embodiment, this thermal zone and the melting of the top portion of the layer are accomplished using a focussed beam of light. The length of the focussed beam along the direction of setter motion is about 1 centimeter. The depth of the granular silicon that is melted depends on the intensity of the input energy from thermal zone 300, the thickness of the granular silicon layer, the linear speed of the granular silicon coated setter through thermal zone 300, and the details of heat transfer between the granular silicon 200 and the setter 100. The outer edges of the melt zone are stabilized by the thermal shunts 120 engineered into the setter 100 or by reducing energy intensity at the edges. These thermal shunts 120 inhibit the depth of melting at the outer edges 210 and thus promote edge stabilization. Between 25 and 90% (and preferably between 50% and 90%) of the granular silicon depth is melted. The material at the bottom of the granular layer is partially melted by liquid silicon penetrating from the molten silicon layer above. This partially melted layer of silicon for a net 220. Other materials incorporated in a substrate designed to be thermally-matched to silicon can be employed as a non-reusable net 220 material. Other materials including fabrics that are woven or non-woven, such as graphite, can be employed as the net 220. Other granular materials that are partially melted or unmelted, such as silicon carbide, can be employed as the net 220 material. The net 220 is responsible for four key process features. First, because it wetted by the molten silicon above, this layer stabilizes the melt and growth zones by defeating the surface tension of the molten silicon over-layer. This allows the production of wide sheets, with smooth surfaces. Second, this layer serves as a plane to nucleate subsequent growth. Third, this layer minimizes molten silicon contact with the supporting setter and release coating, thereby minimizing any potential contamination by impurities. Fourth, this layer serves as highly defected back plane, intrinsically getting impurities from the active silicon layer above, allowing the employment of lower purity, lower-cost grades of silicon raw material.

Where the net 220 is made from a material such as graphite, the graphite could be unrolled and applied over the setter material before the granular silicon is applied. Thus, the net is between the granular silicon and the setter material. The later melted silicon would function as a nucleation site. The net would function to stabilize the melt, minimize molten silicon contact with the underlying setter, and act as a release coating.

Any or all of the preheat, melting, growth, and anneal thermal profiles for the granular powder and resultant sheet could be achieved by graphite based heater technology.

Where the net 220 is made from the materials incorporated in a non-reusable substrate designed to be thermal coefficient-matched to silicon, the substrate could be positioned on the setter material before the silicon is applied. Thus, the nonreusable substrate is between the granular silicon and the setter material. The non-reusable substrate would act as a nucleation site and stabilize the melt. Any or all of the preheat, melting, growth and anneal thermal profiles for the granular powder and resultant sheet could be achieved by graphite-based heater technology.

After leaving the melt creation zone 300 of the thermal profile, the melt pool on the partially melted silicon net 220 moves into the growth zone 400 of the thermal profile. In this zone the growth is initiated on the silicon net 220. Because growth is nucleated from the partially melted silicon net 220, the grain size of the granular silicon 200 is an important parameter in determining the size of the columnar grains in the grown sheet 600. In the preferred embodiment, multi-grained or single crystal granular silicon 200 is used to achieve relatively large columnar grains (average grain size 0.2 to 1.0 mm) in the grown sheet 600. In one embodiment, growth may also be preferentially initiated at sites 210 in the granular silicon layer where the heat transfer is controlled by thermal shunting areas designed in the setter. The direction of the growth front is approximately perpendicular to the plane of the setter. The length of the growth zone along the direction of setter motion is from 2 to 20 centimeters, and is slightly less than the entire length of the melt pool. The length of the growth zone is determined by controlling the rate of loss of heat (and therefore growth rate) attending the solidification process. As a consequence of the growth process, the grains that are grown are columnar in nature. Typically, individual grains in the resulting sheet 600 extend from the top surface to the bottom, and are at least as wide as they are high. Sheet thicknesses in the range of 400 to 500 microns can be achieved at sheet pulling speeds in excess of 30 cm/min.

After leaving the growth zone 400 of the thermal profile, the sheet 600 moves into the annealing zone 500 of the thermal profile. In this zone the grown sheet, still at approximately 1400° C., is subjected to a linear temperature gradient along the direction of setter motion. The linear temperature profile eliminates buckling and cracking of the as-grown sheet, and minimizes the generation of dislocations. The thickness of the grown sheet is in the range of 350 to 1000 microns in the preferred process. Because the thickness of the final grown sheet 600 is determined by the precise application of granular silicon 200 to the setter 100, exceptional sheet thickness control and process stability are achieved in comparison to sheet technologies pulled from a melt, where thickness is controlled by the melt meniscus. After cool down, the sheet is removed from the setter, and appropriately sized by sawing or scribing, for fabrication into solar cells. The setter is reused for making further columnar-grained polycrystalline sheets.

The properties of the sheet material fabricated with the above process are quite amenable to the fabrication of efficient solar cells. This process generates material that has unique properties of size and character. Although the gains are columnar, and have average sizes in the range of 0.1 to 1 mm in extent, solar cells fabricated on it may achieve voltages in excess of 560 mV, and fill factors in excess of 0.72. The achievement of these values on such small grained material indicate that this material is not being limited by recombination at gain boundaries as had been previously predicted by Ghosh. Previously, columnar grains were dismissed as being ineffective since columnar grains were always small, and small grains were thought not to work. The process herein described achieves columnar grains that yield material with relatively benign grain boundaries with the result that efficient, low-cost solar cells can be manufactured.

The process herein described can be carried out in a continuous manner, resulting in continuous sheets that can be appropriately sized using an in line scribe or a saw. Impurity content in the melt and grown sheet quickly reaches steady-state; it does not increase during continuous processing. Since all embodiments include application of granular silicon to the setter, and since material enters the melt creation zone in this form, melt replenishment is not a problem, unlike sheet technologies pulled from a melt pool. After being properly sized, the sheets function as a substrate by having the remaining layers formed thereon to produce solar cells. Where the remaining layers are of silicon, a completely silicon solar cell results.

What is claimed is:

1. A process of making an improved columnar-grained polycrystalline sheet for functioning as a substrate for a solar cell, comprising (a) applying granular silicon to a setter material having a release coating at its upper surface and which supports the granular silicon, (b) preheating the setter material and granular silicon in a preheat zone, (c) subjecting the setter material and granular silicon to a thermal profile which causes melting of the granular silicon from the top downwardly, wherein 25 to 90% of the granular silicon depth is melted and the partially melted silicon below the melted material functions as a net to stabilize the melt and to minimize molten silicon contact with the underlying setter material and release coating and to nucleate subsequent crystal growth, (d) transporting the melt pool on the silicon net into a growth zone wherein a thermal profile is created to promote columnar growth of a columnar grain size greater than 80 microns from the partially melted silicon net upward in a direction approximately perpendicular to the plane of the setter material and where both liquid and a growing polycrystalline layer coexist and impurities are segregated to the top surface of the sheet as well as gettered to the partially melted back surface, (e) transporting the grown sheet into an anneal zone wherein a linear temperature gradient along the direction of setter material motion is provided to promote low stress cooling of the sheet, (f) removing the polycrystalline sheet from the setter material, facilitated by a release agent, and (g) reusing the setter material for the making of further columnar-grained polycrystalline sheets.

2. The process of claim 1 including achievement of any or all of the preheat, melting, growth, and anneal thermal profiles for the granular silicon and resultant sheet by focused light energy.

3. The process of claim 1 including creating an electrical resistivity in the sheet layer in the range of 0.1 to 10 ohm-cm by adding separate constituents to the granular silicon.

4. The process of claim 1 including the use of granular silicon sized between 100 to 1000 micrometers, which has a purity between metallurgical grade and electronic grade silicon.

5. The process of claim 1 including stabilizing the outer edges of the melt zone by thermal shunts, or reduced energy intensity at the edge of the melt.

6. The process of claim 1 including forming nucleation sites in the setter material to commence growth by locally placing thermal shunts in the setter material to provide a thermal conduction path between the top and the bottom of the setter material.

7. The process of claim 1 wherein multi-grained or single crystal granular silicon is used to nucleate columnar grains having an average grain size of 0.2 to 1 mm in the subsequent sheet.

8. The process of claim 1 wherein the setter material is selected from the group consisting of quartz, silica, alumina, graphite, and SiC.

9. The process of claim 1 wherein the setter material is replaced by a thin belt material which supports the sheet during formation and thermal processing, and does not chemically interact with, or adhere to, the silicon material.

10. The process of claim 1 wherein the resulting silicon sheet has the characteristics of flatness, a smooth surface, minority carrier diffusion length greater than 40 microns, low residual stress, and relatively inactive grain boundaries.

11. The process of claim 1 including utilizing the sheet as a substrate for a solar cell by forming the additional solar cell layers on the substrate.

12. A solar cell made by the process of claim 11.

13. A substrate made by the process of claim 1.

14. The process of claim 1 wherein the partially melted silicon net and is replaced by a non-melting, non-reusable, thermal coefficient-matched substrate which is wetted by and stabilizes the molten silicon over-layer, nucleates subsequent growth, and serves as a supporting substrate during subsequent solar cell processing of the grown sheet.

15. The process of claim 14 including utilizing the sheet as a substrate for a solar cell by forming the additional solar cell layers on the substrate.

16. A substrate made by the process of claim 14.

17. A solar cell made by the process of claim 15.

18. The process of claim 14 wherein graphite is used as the substrate.

19. The process of claim 1 including achievement of any or all of the preheat, melting, growth, and anneal thermal profiles for the granular silicon and resultant sheet by graphite based heater technology.

20. A process of making an improved columnar-grained polycrystalline sheet for functioning as a substrate for a solar cell, comprising (a) applying a net to a setter material, (b) applying granular silicon to the setter material and the net whereby to support the granular silicon, (c) preheating the setter material and the net and the granular silicon in a preheat zone, (d) subjecting the setter material and the net and the granular silicon to a thermal profile which causes melting of the granular silicon from the top downwardly, wherein 25 to 90% of the granular silicon depth is melted and the partially melted silicon below the melted material functions as a nucleation site to nucleate subsequent crystal growth and the net functions to stabilize the melt and to minimize molten silicon contact with underlying setter and the net functions as a release coating, (e) transporting the melt pool on the net into a growth zone wherein a thermal profile is created to promote columnar growth of a columnar grain size greater than 80 microns from the partially melted silicon upward in a direction approximately perpendicular to the plane of the setter material and where both liquid and a growing polycrystalline layer coexist and impurities are segregated to the top surface of the sheet as well as gettered to the partially melted back surface, (f) transporting the grown sheet into an anneal zone wherein a linear temperature gradient along the direction of setter material motion is provided to promote low stress cooling of the sheet, (g) removing the polycrystalline sheet from the setter material, facilitated by a release agent, and (h) reusing the setter material for the making of further columnar-grained polycrystalline sheets.

21. The process of claim 20 wherein the net is made from a graphite material.

22. The process of claim 21 including achievement of any or all of the preheat, melting, growth, and anneal thermal profiles for the granular silicon and resultant sheet by graphite based heater technology.

23. The process of claim 20 wherein the net is made from silicon carbide.

24. The process of claim 20 including achievement of any or all of the preheat, melting, growth, and anneal thermal profiles for the granular silicon and resultant sheet by graphite based heater technology.

25. The process of claim 20 including utilizing the sheet as a substrate for a solar cell by forming the additional solar cell layers on the substrate.

26. A solar cell made by the process of claim 25.

27. A substrate made by the process of claim 20.

28. A process of making an improved columnar-grained polycrystalline sheet for functioning as a substrate for a solar cell, comprising (a) providing a layer of graphite material, (b) applying granular silicon to the graphite material whereby to support the granular silicon, (c) preheating the graphite material and the granular silicon in a preheat zone, (d) subjecting the graphite material and the granular silicon to a thermal profile which causes melting of the granular silicon from the top downwardly, wherein 25 to 90% of the granular silicon depth is melted and the partially melted silicon below the melted material functions as a nucleation site to nucleate subsequent crystal growth and the graphite material functions as a release coating, (e) transporting the melt pool on the graphite material into a growth zone wherein a thermal profile is created to promote columnar growth of a columnar grain size greater than 80 microns from the partially melted silicon upward in a direction approximately perpendicular to the plane of the graphite material and where both liquid and a growing polycrystalline layer coexist and impurities are segregated to the top surface of the sheet as well as gettered to the partially melted back surface, (f) transporting the grown sheet into an anneal zone wherein a linear temperature gradient along the direction of graphite material motion is provided achieved to promote low stress cooling of the sheet, (g) removing the polycrystalline sheet from the graphite material, and (h) reusing the graphite material for the making of further columnar-grained polycrystalline sheets.

29. The process of claim 28 including utilizing the sheet as a substrate for a solar cell by forming the additional solar cell layers on the substrate.

30. A solar cell made by the process of claim 29.

31. A substrate made by the process of claim 28.

* * * * *

UNITED STATES PATENT AND TRADEMARK OFFICE
CERTIFICATE OF CORRECTION

PATENT NO. : 5,336,335
DATED : August 9, 1994
INVENTOR(S) : Robert B. Hall, et. al.

It is certified that error appears in the above-indentified patent and that said Letters Patent is hereby corrected as shown below:

| Column | Line | |
|---|---|---|
| 2 | 15 | "gain" should be "grain" |
| 2 | 27 | "gained" should be "grained" |
| 2 | 50 | "slowing" should be "showing" |
| 2 | 51 | "cells" should be "cell" |
| 3 | 3 | "gain" should be "grain" |
| 3 | 30 | "manufactuarability" should be "manufacturability" |
| 4 | 68 | "one" should be--"the"--. |
| 5 | 52 | "for" should be "forms" |
| 6 | 1 | after the word "as" insert --a-- |
| 6 | 2 | "getting" should be "gettering" |
| 7 | 12 | "gains" should be "grains" |
| 7 | 18 | "gain" should be "grain" |
| 8 | 68 | delete "whereby" |

Signed and Sealed this

Twenty-eight Day of March, 1995

Attest:

BRUCE LEHMAN

*Attesting Officer*     *Commissioner of Patents and Trademarks*